(12) United States Patent
Bae (10) Patent No.: US 8,653,660 B2
(45) Date of Patent: Feb. 18, 2014

(54) SEMICONDUCTOR DEVICE AND PACKAGE (71) Applicant: SK hynix Inc., Incheon-si (KR)

(72) Inventor: Jin Ho Bae, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/778,413

(22) Filed: Feb. 27, 2013

(65) Prior Publication Data

US 2013/0168875 A1   Jul. 4, 2013

Related U.S. Application Data (62) Division of application No. 13/168,107, filed on Jun. 24, 2011, now Pat. No. 8,410,603.

(30) Foreign Application Priority Data

Jul. 8, 2010 (KR) .................. 10-2010-0066041

(51) Int. Cl.
*H01L 23/48* (2006.01)
(52) U.S. Cl.
USPC .......... 257/737; 257/782; 257/724; 257/784; 438/118; 438/612; 438/617

(58) Field of Classification Search
USPC ............... 257/737, 782, 724, 784, E23.003, 257/E23.001; 438/106, 118, 612, 617
See application file for complete search history.

(56) References Cited

U.S. PATENT DOCUMENTS

| | | | | |
|---|---|---|---|---|
| 6,418,033 | B1 * | 7/2002 | Rinne | 361/784 |
| 7,034,393 | B2 * | 4/2006 | Alie et al. | 257/704 |
| 7,067,927 | B1 * | 6/2006 | Mostafazadeh | 257/777 |
| 7,132,739 | B2 * | 11/2006 | Akiba et al. | 257/686 |
| 7,190,060 | B1 * | 3/2007 | Chiang | 257/686 |
| 7,518,156 | B2 * | 4/2009 | Hasebe et al. | 257/98 |
| 7,671,459 | B2 * | 3/2010 | Corisis et al. | 257/686 |
| 7,834,464 | B2 * | 11/2010 | Meyer et al. | 257/777 |
| 7,843,050 | B2 * | 11/2010 | Eng et al. | 257/686 |
| 7,977,715 | B2 * | 7/2011 | Cai | 257/288 |
| 2009/0065902 | A1 * | 3/2009 | Yu et al. | 257/620 |
| 2012/0286421 | A1 * | 11/2012 | Liu | 257/737 |

* cited by examiner

*Primary Examiner* — Julio J Maldonado
*Assistant Examiner* — Robert Bachner
(74) *Attorney, Agent, or Firm* — William Park & Associates Patent Ltd.

(57) ABSTRACT

A semiconductor device includes a semiconductor substrate having an upper surface, a lower surface, a first side and a second side, wherein the lower surface has a slope so that the first side is thicker than the second side, and a circuit pattern including a bonding pad on the upper surface of the semiconductor substrate.

6 Claims, 7 Drawing Sheets

SEMICONDUCTOR DEVICE AND PACKAGE

CROSS-REFERENCES TO RELATED APPLICATIONS

The present application claims priority under 35 U.S.C 119(a) to Korean Application No. 10-2010-0066041, filed on Jul. 8, 2010, in the Korean intellectual property Office, which is incorporated herein by reference in its entirety set forth in full.

BACKGROUND

Exemplary embodiments of the present invention relate to a package technology, and more particularly, to a semiconductor device and package using a slant backgrinding.

In order to implement a high-density small-sized semiconductor device, much development is being made on a stack package in which a plurality of semiconductor chips are stacked. Bonding pads for electrical connection are arranged on the surfaces of the stacked semiconductor chips, and wire bonding is used to electrically connect the bonding pads to a package substrate on which the semiconductor chips are stacked.

Since a plurality of semiconductor chips are stacked, the upper chip stacked on the lower chip may come into contact with the bonding wire connected to the lower chip, causing the bonding wire to be electrically shorted or damaged. To overcome such a problem, spacer layers or spacer tapes for ensuring a spacing between stacked chips may be arranged in order to guarantee a loop height margin of a bonding wire. In this case, the spacer layers and adhesive layers formed under and above the spacer layers may increase the total height of the package. Consequently, the number of stackable chips may decrease.

Meanwhile, a wire may penetrate through a wafer backside lamination (WBL) layer. However, since the bonding wire penetrates through the lamination layer, it may be difficult to control a loop of the bonding wire and the reliability of the lamination layer may become low. In addition, a stair type stack structure may be considered. Regarding the stair type stack structure, the chips may be stacked while being deviated in a lateral direction, so that the upper chip does not cover the bonding pad region of the lower chip. However, such a stack package may have disadvantages in that the area of the package increases and the length of the bonding wire gradually increases toward the upper chips.

SUMMARY

An embodiment of the present invention relates to a semiconductor chip and package which can guarantee a margin of a bonding wire while semiconductor chips are stacked without increasing a package area.

In an exemplary embodiment of the present invention, a semiconductor device includes a semiconductor substrate having an upper surface, a lower surface, a first side and a second side, wherein the lower surface has a slope so that the first side is thicker than the second side, and a circuit pattern including a bonding pad on the upper surface of the semiconductor substrate.

In another exemplary embodiment of the present invention, a semiconductor package includes a first and a second semiconductor chips, each having an upper surface, a lower surface, a first side and a second side, wherein the lower surface has a slope so that the first side is thicker than the second side, a spacer formed between the first and the second semiconductor chips, wherein the first side of the first semiconductor chip is arranged over the second side of the second semiconductor chip, a bonding pad formed on an edge portion of the upper surface, and a substrate, on which the first and the second semiconductor chips and the spacer are mounted, electrically connected to the first and the second semiconductor chips.

In yet another exemplary embodiment of the present invention, a semiconductor package includes a substrate, a plurality of semiconductor chips stacked on the substrate, wherein the semiconductor chips have slant lower surfaces, and slant directions of the slant lower surfaces of the semiconductor chips are alternately directed, a plurality of connection pads arranged at edge portions of upper surfaces of the semiconductor chips, a plurality of spacers arranged between the semiconductor chips to expose the connection pads, and a plurality of bonding wires coupling the connection pads and the substrate.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Embodiments of the present invention relate to a slant backside of a chip by performing a backgrinding so that an edge portion, where a bonding pad for a wire bonding of a semiconductor chip is located, has more space for the wire bonding. According to an exemplary embodiment, in a case that another semiconductor chip is stacked over a semiconductor chip, the bonding pad is formed on the edge portion of the semiconductor chip and the edge portion of the another semiconductor chip located over the bonding pad is thinner than the other edge portion. Since a bonding wire is bonded to a bonding pad located at such a position, a loop height of a bonding wire can be secured, thereby guaranteeing a loop margin. In addition, an opposite edge portion of the another semiconductor chip where a wire bonding is performed can be maintained at a relatively large thickness. Thus, a probability of forming of a defect due to a small chip thickness may decrease.

Figure 1:
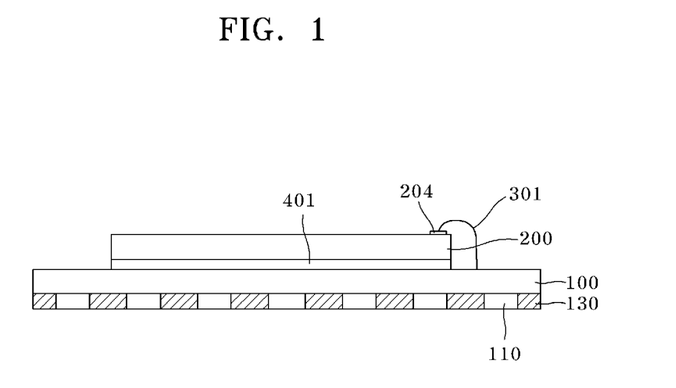
FIGS. 1 to 4 illustrate a semiconductor device having a slant lower surface and a semiconductor package including the same according to an exemplary embodiment of the present invention.

A semiconductor device, a semiconductor package, and a method for manufacturing the same according to embodiments of the present invention will be described below with reference to FIG. 1. Referring to FIG. 1, a bottom semiconductor chip 200 is attached and stacked on a substrate 100 on which a chip such as a printed circuit board (PCB) is to be stacked. The substrate 100 may be provided so that ball lands 110, which solder balls are to be attached to, are isolated by solder resists 130. The ball lands 110 may be electrically connected to bonding wires through circuit interconnections formed in the substrate 100. A backgrinding is performed on the bottom semiconductor chip 200 to make its lower surface flat. Then, the bottom semiconductor chip 200 is picked up and attached to the substrate 100 through an attach process. After the bottom semiconductor chip 200 is attached to the substrate 100, a bottom bonding wire 301 is wire-bonded to connect the substrate 100 and a bonding pad 204 formed on the bottom semiconductor chip 200. Here, the bonding pad 204 is arranged on, for example, only an edge portion of the substrate 100, and a process of forming a redistribution layer may be performed in order to limit the position of the bonding pad 204 to the edge portion. In order for a chip attachment, an adhesive layer 401 may be formed at the interface between the bottom semiconductor chip 200 and the substrate 100.

Meanwhile, the bottom semiconductor chip 210 may be a system semiconductor, a memory semiconductor, a controller, an image sensor, a graphic processing unit (GPU), an image sensor, or a communication chip such as a RFID chip, a CDMA chip and a GSM chip. In addition, the bottom semiconductor chip 210 may be electrically connected to the substrate 100 by a through electrode or a bump.

Figure 2:
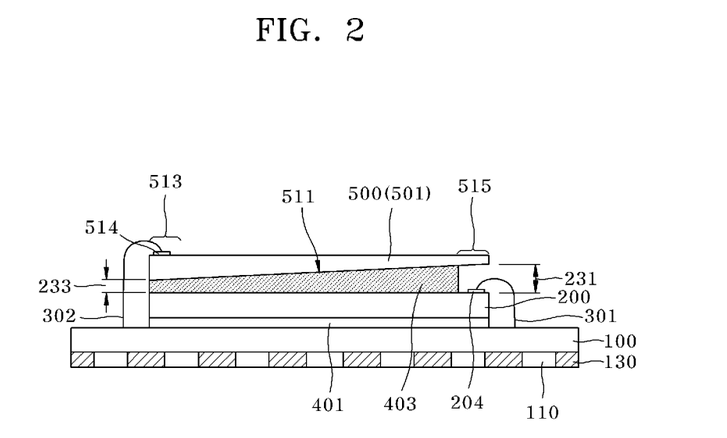

Referring to FIG. 2, a plurality of semiconductor chips 500 which have slant lower surfaces 511 and are to be stacked on the bottom semiconductor chip 200 are prepared. Each of the semiconductor chips 500 has a semiconductor substrate having an upper surface and a lower surface. The lower surface of the semiconductor substrate has a slope and thus a side of the semiconductor substrate is thicker than the other side thereof. In addition, the semiconductor chip 500 may include a circuit pattern on the upper surface of the semiconductor substrate, wherein the circuit pattern includes a bonding pad 514. The slant lower surface 511 is prepared by performing a slant backgrinding on the lower surface of the semiconductor chip 500 so that a first edge portion 513 of a side is relatively thick and a second edge portion of the other side is relatively thin. Here, the second edge portion 515 has 30% to 80% of the thickness of the first edge portion 513.

The stacked semiconductor chips 500 and the bottom semiconductor chip 200 may have different lower surface states. Here, the bonding pad 514 to be bonded to the bonding wire 302 is arranged on, for example, only the first edge portion 513 which is relatively thick. In addition, the stacked semiconductor chips 500 are stacked on the region where the bonding pad 204 of the bottom semiconductor chip 200 is formed, so that they are overlapped with the second edge portion 515 which is relatively thin. An adhesive layer 403 is coated on the lower surface of the semiconductor chip 500, so that the region of the bonding pad 204 is exposed, and a pressure and a heat are applied to stack the semiconductor chip 500. The adhesive layer 403 serves as a spacer. The spacer of the adhesive layer 403 is formed on the lower surface of the semiconductor substrate which is the semiconductor chip 500. The first surface has a slope corresponding to the slope of the lower surface of the semiconductor substrate. The lower surface is in parallel to the upper surface of the semiconductor substrate.

Here, the upper surface of the semiconductor chip 500 is maintained to be flat, and the adhesive layer 403 is formed to have a slant lower surface along the profile of the slant lower surface 511. That is, the adhesive layer 403 is formed to be gradually thicker (or thinner).

Since the stacked semiconductor chips 500 have the slant lower surfaces, the spacing 231 is ensured to be larger than the loop height of the bonding wire 301 under the second edge portion 515 when the front sides of the stacked semiconductor chips 500 are stacked to be flat. Since the loop height margin of the bonding wire 301 is effectively ensured, it is possible to effectively prevent the defects, such as damage or electrical short, which are caused by the contact of the semiconductor chip 500 on which the bonding wire 301 is stacked. Since such a loop height margin is ensured by the slant lower surface 511 of the semiconductor chip 500, the height from the surface of the substrate 100 to the surface of the stacked semiconductor chips 500 may become thin, in spite of the stacking of the semiconductor chips 500. Accordingly, the total package height becomes thin and the semiconductor chip 500 is overlappingly stacked in such a state that it is vertically aligned without departing from the bottom semiconductor chip 200. Consequently, an increase of an area in a lateral direction can be effectively suppressed. A smaller spacing 233 is provided under the first edge portion 513 opposite to the second edge portion 515. However, since the bonding wire 301 is not formed within the small spacing 233, the bonding wire 301 is not damaged or shorted by the small spacing 233. In addition, while the second edge portion 515 is thin, the first edge portion 513 is relatively thick. That is, the thickness of the stacked semiconductor chip 500 becomes locally thin, thereby overcoming the problems such as a chip damage caused by the reduced thickness.

Figure 3A:
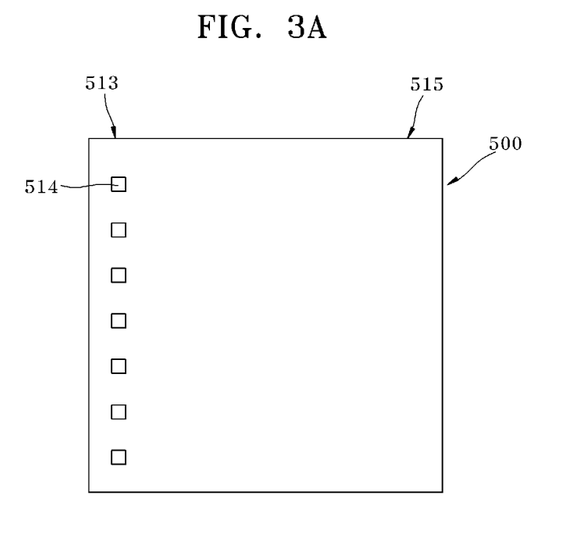
Figure 3B:
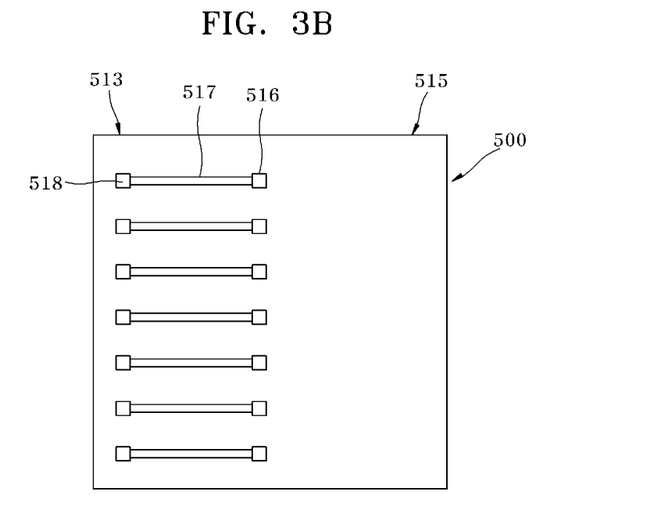

In order to stack the semiconductor chips 500 having the slant lower surfaces 511, the bonding pad 514 has a structure in which it is arranged on, for example, only one edge portion, as illustrated in FIG. 3A. Therefore, as illustrated in FIG. 3B, a redistribution layer 517 may be formed on the semiconductor chip 500 in order that the bonding pad 514 is not formed in the center portion or the second edge portion 515 opposite to the first edge portion 513 and the bonding pad 514 is limited to only the first edge portion 513. For example, a redistribution layer 517 may be further formed to extend from an original pad 516, which is formed at the center portion, toward an external bonding pad 518.

Figure 4:
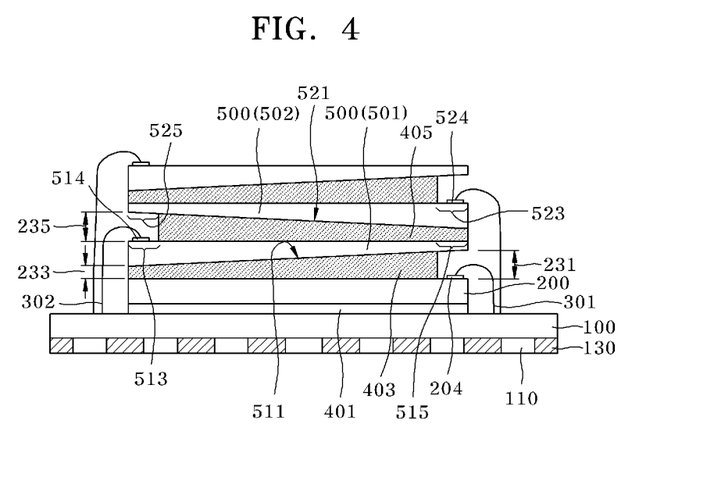

Referring to FIG. 4, the stack number may be increased by sequentially stacking the semiconductor chips 500 having the slant lower surfaces 511. For example, after coupling the first bonding wire 301 connected to the bottom semiconductor chip 200, the first semiconductor chip 501 is stacked. The second bonding wire 302 coupling the bonding pad 513 and the substrate 100 is connected, and the second semiconductor chip 502 having the slant lower surface 521 is stacked on the first semiconductor chip 501 by using the adhesive layer 405. The adhesive layers 403 and 405 may be provided in a paste form. At this time, the first semiconductor chip 501 and the second semiconductor chip 502 are formed while changing their directions alternately, so that the second edge portion 525 of the second semiconductor chip 502 is overlapped with the first edge portion 513 of the first semiconductor chip 501. Accordingly, the bonding pad 524 of the second semiconductor chip 502 is formed to face the bonding pad 514 of the first semiconductor chip 501. Since the second edge portion 525 having a relatively small thickness is overlapped on the bonding pad 514 of the first semiconductor chip 501, a third spacing 235 is ensured relatively largely like the first spacing 231. Therefore, the loop height margin of the bonding wire 302 connected to the bonding pad 514 of the first semiconductor chip 501 can also be effectively ensured. In this manner, the semiconductor chips 501 and 502 may be sequentially stacked.

Figure 5:
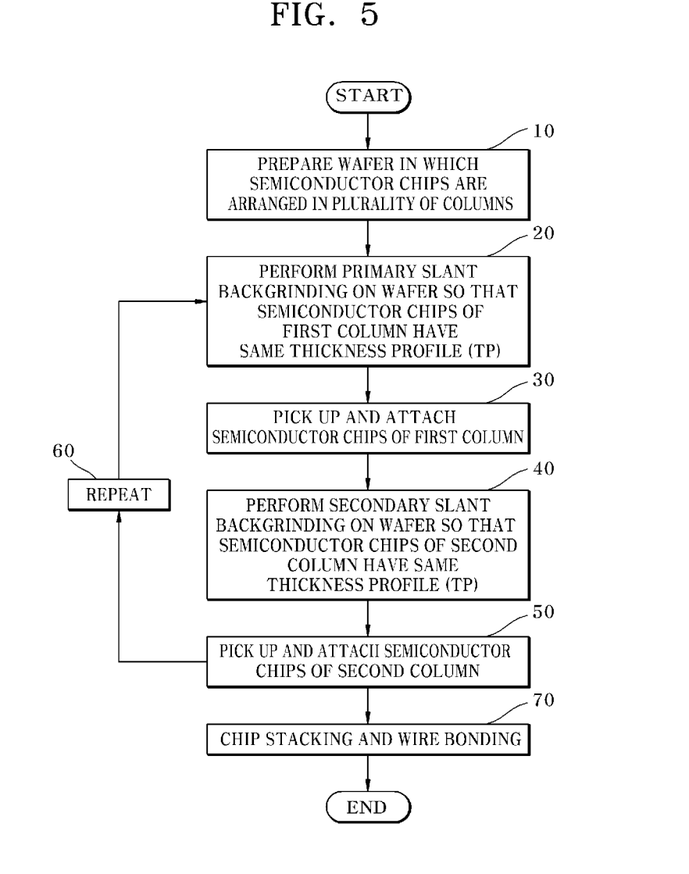
FIG. 5 is a flowchart illustrating a method for manufacturing a semiconductor device and a semiconductor package according to another exemplary embodiment of the present invention.
Figure 6:
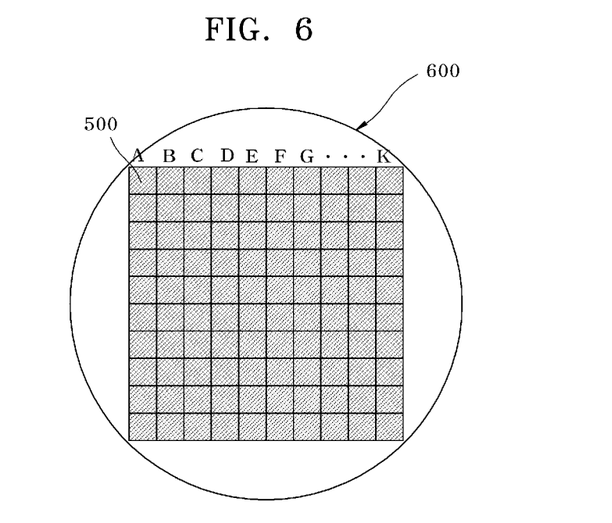
FIGS. 6 to 10 illustrate a slant backgrinding according to another exemplary embodiment of the present invention.
Figure 7:
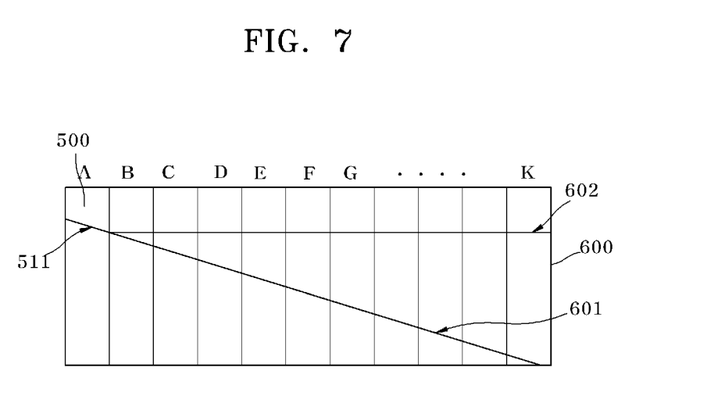

Since the method for manufacturing the semiconductor package according to the embodiment of the present invention uses the semiconductor chips 500 having the slant lower surfaces 511 and 512, a slant backgrinding is performed so that the semiconductor chips 500 have the slant lower surfaces 511 and 521. Referring to FIGS. 5 and 6, a wafer 600 in which semiconductor chips (500 in FIG. 6) are arranged in a plurality of columns A, B, C, D, E, F, G, . . . , K, is prepared (10 in FIG. 5). Referring to FIG. 7, a primary slant backgrinding is performed on the lower surface 511 of the wafer 600 in which the semiconductor chips 500 of the first column A have the same thickness profile (Tp) or slant profile (20 in FIG. 5). The primary slant backgrinding is performed on the wafer up to the first slant lower surface 601. Accordingly, the slant lower surface 511 is formed by the primary slant backgrinding. At this time, the slant lower surfaces 511 of the semiconductor chips 500 may has a smaller thickness than that of the semiconductor chip 500, as compared to a typical backgrinding which provides a flat lower surface 602.

Figure 8:
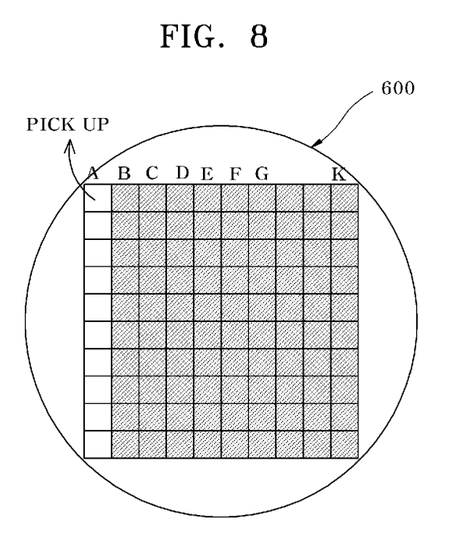

Referring to FIG. 8, the semiconductor chips 500 of the first column A are picked up and attached (30 in FIG. 5). A chip sawing process for pick-up may be performed after or before the primary slant backgrinding. Alternatively, the chip sawing process may be performed by a half cutting dicing which separate the chips 500 when the slant lower surface 511 is formed by the primary slant backgrinding after sawing the wafer to a depth at which the chips 500 can be separated, for example, a depth at which the flat lower surface 602 is to be formed.

Figure 9:
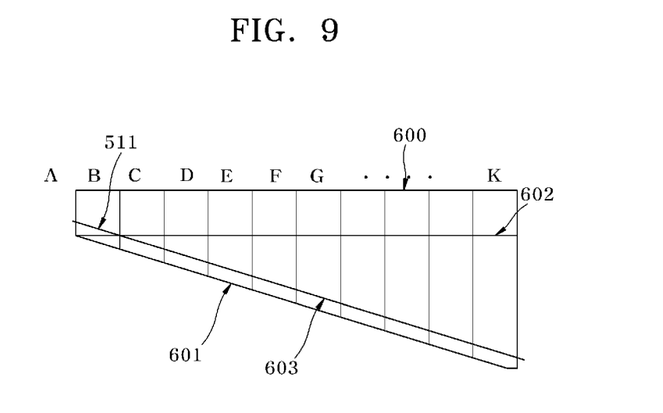
Figure 10:
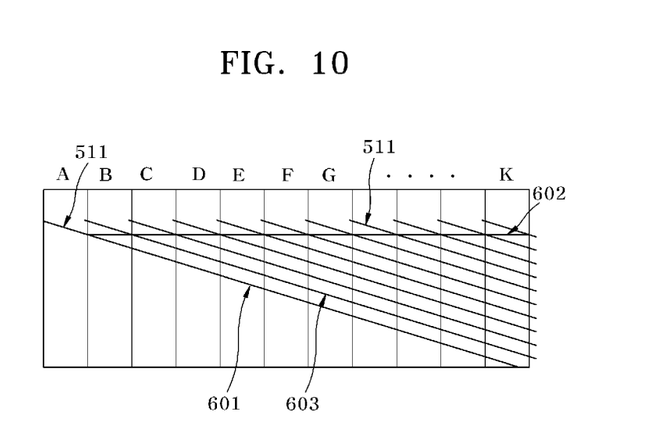

Referring to FIG. 9, a secondary slant backgrinding is performed on the wafer 600 so that the semiconductor chips 500 of the second column B have the same thickness profile as that of the semiconductor chips 500 of the first column A (40 in FIG. 5). The secondary slant backgrinding is performed on the wafer up to the second slant lower surface 603. Thus, the secondary slant backgrinding may be performed within the same apparatus at the same angle as that of the primary slant backgrinding. Then, the semiconductor chips 500 of the second column B are picked up and attached. By repeating such procedures (60 in FIG. 5), the semiconductor chips 500 having the same slant lower surfaces 511 may be implemented. As illustrated in FIG. 10, a slant backgrinding is sequentially performed on the semiconductor chips 500 of the columns C, D, . . . , K, and the semiconductor chips 500 are picked up and attached. As described above with reference to FIGS. 2 to 4, the semiconductor chips 500 having the slant lower surfaces 511 are stacked and wire-bonded to complete the package (70 in FIG. 5).

The stack package and the manufacturing method thereof according to the embodiments of the present invention can effectively ensure the loop margin upon the wire bonding, reduce the package size, and increase the stack density.

According to the embodiments of the present invention, the semiconductor chips are formed to have the slant lower surfaces, and the chips are stacked so that slant lower surface directions vertical to the slant lower surfaces are alternately changed along the stacking order. A relatively large spacing is provided on the one edge portion of the chip, and a relatively small spacing is provided on the other edge portion thereof. The bonding pads are formed on the edge portions of the chips implemented at the relatively large spacing. Therefore, the loop margin of the bonding wires connected to the bonding pads can be ensured. Hence, the semiconductor chip and package can ensure a high margin of the bonding wire while stacking the chips without increasing the area of the package.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor device comprising:
    a semiconductor substrate having an upper surface, a lower surface, a first side and a second side, wherein the lower surface has a slope so that the first side is thicker than the second side; and
    a circuit pattern including a bonding pad on the upper surface of the semiconductor substrate.

2. The semiconductor device of claim 1, wherein the bonding pad is formed on an edge portion of the upper surface of the semiconductor substrate.

3. The semiconductor device of claim 2, further comprising a redistribution line configured to connect the boding pad and another pad of the semiconductor substrate.

4. The semiconductor device of claim 1, wherein the second side of the semiconductor substrate has 30% to 80% of the thickness of the first side thereof.

5. The semiconductor device of claim 1, further comprising a spacer on the lower surface of the semiconductor substrate, wherein the upper surface of the spacer has a slope corresponding to a slope of the lower surface of the semiconductor substrate.

6. The semiconductor device of claim 5, wherein the spacer is shorter than the semiconductor substrate such that the semiconductor substrate exposes an edge portion of the upper surface of the semiconductor substrate.

* * * * *